United States Patent
Wang et al.

(10) Patent No.: US 10,672,757 B2
(45) Date of Patent: Jun. 2, 2020

(54) MULTIPHASE PARALLEL DIRECT-CURRENT (DC) TO DC CIRCUIT AND CHIP STRUCTURE THEREOF

(71) Applicant: Huawei Technologies Co., Ltd., Shenzhen (CN)

(72) Inventors: Jiake Wang, Shenzhen (CN); Yue Chen, Chengdu (CN); Qiang Xie, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/518,373

(22) Filed: Jul. 22, 2019

(65) Prior Publication Data

US 2019/0348408 A1 Nov. 14, 2019

Related U.S. Application Data

(63) Continuation of application No. PCT/CN2017/096166, filed on Aug. 7, 2017.

(30) Foreign Application Priority Data

Feb. 15, 2017 (CN) .......................... 2017 1 0081245

(51) Int. Cl.
*H02M 3/158* (2006.01)
*H01L 27/02* (2006.01)
*H02M 1/00* (2006.01)

(52) U.S. Cl.
CPC ........ *H01L 27/0207* (2013.01); *H02M 3/158* (2013.01); *H02M 2001/007* (2013.01)

(58) Field of Classification Search
CPC .... H02M 3/157; H02M 3/158; H02M 3/1584; H02M 2001/007; H01L 27/02; H01L 27/0207
See application file for complete search history.

(56) References Cited

U.S. PATENT DOCUMENTS 7,839,168 B2 * 11/2010 Wielage ............... G11C 19/287
326/38
8,502,515 B1 8/2013 Wan et al.
(Continued)

FOREIGN PATENT DOCUMENTS

CN 1639657 A 7/2005
CN 101813956 A 8/2010
(Continued)

OTHER PUBLICATIONS

Machine Translation and Abstract of Chinese Publication No. CN102195461, Sep. 21, 2011, 14 pages.
(Continued)

*Primary Examiner* — Matthew V Nguyen
(74) *Attorney, Agent, or Firm* — Conley Rose, P.C.

(57) ABSTRACT

A multiphase parallel digital current (DC) to DC converter (DCDC) circuit includes a loop operational amplifier (EA) unit, N output-stage circuit units, and M drive units, where a drive unit corresponds to at least one output-stage circuit unit including a comparator (COMP) and a power stage circuit, an output end of the loop operational amplifier EA unit is connected to an input end of the drive unit, an output end of the drive unit is connected to an input end of a COMP in a corresponding output-stage circuit unit, and an output end of the COMP is connected to an input end of a power stage circuit in the same output-stage circuit unit, and an input end of the loop operational amplifier EA unit is connected to output ends of all the power stage circuits.

20 Claims, 8 Drawing Sheets

(56) References Cited

U.S. PATENT DOCUMENTS

| | | | |
|---|---|---|---|
| 8,917,075 B2 | 12/2014 | Leipold et al. | |
| 8,957,660 B2* | 2/2015 | Chen | H02M 1/084 323/272 |
| 10,263,524 B2* | 4/2019 | Hang | H02M 3/1584 |
| 2007/0024253 A1 | 2/2007 | Schuellein et al. | |
| 2007/0120548 A1 | 5/2007 | Kojima et al. | |
| 2010/0013305 A1 | 1/2010 | Heineman | |
| 2010/0066319 A1 | 3/2010 | Qiu et al. | |
| 2010/0072968 A1 | 3/2010 | Bianco et al. | |
| 2011/0285370 A1 | 11/2011 | Gritti | |
| 2014/0266119 A1 | 9/2014 | Burton et al. | |
| 2015/0194877 A1* | 7/2015 | Hsiao | H02M 3/07 363/70 |
| 2015/0222182 A1 | 8/2015 | Searles et al. | |
| 2018/0183337 A1* | 6/2018 | Huang | H02M 3/1582 |

FOREIGN PATENT DOCUMENTS

| | | |
|---|---|---|
| CN | 102195461 A | 9/2011 |
| CN | 103248231 A | 8/2013 |
| CN | 103701321 A | 4/2014 |
| CN | 104113212 A | 10/2014 |
| CN | 104393751 A | 3/2015 |
| CN | 104901387 A | 9/2015 |
| CN | 105960617 A | 9/2016 |
| CN | 106685226 A | 5/2017 |

OTHER PUBLICATIONS

Machine Translation and Abstract of Chinese Publication No. CN103248231, Aug. 14, 2013, 15 pages.
Machine Translation and Abstract of Chinese Publication No. CN103701321, Apr. 2, 2014, 15 pages.
Machine Translation and Abstract of Chinese Publication No. CN104393751, Mar. 4, 2015, 11 pages.
Machine Translation and Abstract of Chinese Publication No. CN104901387, Sep. 9, 2015, 11 pages.
Machine Translation and Abstract of Chinese Publication No. CN106685226, May 17, 2017, 25 pages.
Foreign Communication From a Counterpart Application, Chinese Application No. 201710081245.5, Chinese Office Action dated Jul. 5, 2018, 6 pages.
Foreign Communication From a Counterpart Application, PCT Application No. PCT/CN2017/096166, English Translation of International Search Report dated Nov. 16, 2017, 3 pages.
Foreign Communication From a Counterpart Application, PCT Application No. PCT/CN2017/096166, English Translation of Written Opinion dated Nov. 16, 2017, 5 pages.
Kinzer, D., et al., "Advanced power semiconductors and ICs for DC/DC converter applications," XP004487510, Microelectronics Journal, Mackintosh Publications Ltd. Luton, GB, vol. 35, No. 3, Mar. 1, 2004, 9 pages.
Huang, W., et al., "A scalable Multiphase Buck Converter with Average Current Share Bus," APEC, 18th Annual IEEE Applied Power Electronics Conference and Exposition, Miami Beach, FL,, [Annual Applied Power Electronics Conference], New York, NY:IEEE, US, vol.1, XP032155936, Feb. 9-13, 2003, pp. 438-443.
Foreign Communication From a Counterpart Application, European Application No. 17896330.2, Extended European Search Report dated Jan. 24, 2020, 7 pages.

* cited by examiner

MULTIPHASE PARALLEL DIRECT-CURRENT (DC) TO DC CIRCUIT AND CHIP STRUCTURE THEREOF

CROSS-REFERENCE TO RELATED APPLICATIONS

This application is a continuation of International Application No. PCT/CN2017/096166, filed on Aug. 7, 2017, which claims priority to Chinese Patent Application No. 201710081245.5, filed on Feb. 15, 2017, both of which are hereby incorporated by reference in their entireties.

TECHNICAL FIELD

This application relates to the field of circuits, and in particular, to a multiphase parallel digital current (DC) to DC converter (DCDC) circuit and a chip structure thereof.

BACKGROUND

Rapid development of consumer electronics imposes an increasingly high demand and performance requirement on an integrated voltage regulator (IVR) in a power management integrated circuit (PMIC) in the electronics, and also requires a higher output loading capability of an IVR. A main trend is to improve the loading capability by using a multiphase parallel DCDC circuit. In addition, a response of the IVR to a transient jump of an output load is required to be as fast as possible, and a common method is increasing a switching frequency of the IVR or increasing a loop bandwidth.

In a scenario in which an output loading capability of an IVR is required to reach tens of amperes to hundreds of amperes, a quantity of parallel DCDC circuits needs to reach 16 phases, 32 phases, or more phases. As shown in FIG. 1, a block diagram of a principle of a 4-phase parallel buck conversion (BUCK) type DCDC circuit is provided. An output voltage (VEAOUT) of an error amplifier (EA) is connected to negative ends of four comparators (COMPs), positive ends of the COMPs are separately connected to a preset triangular wave signal (VSAW) such that square voltage signals having a predetermined duty cycle are separately generated, and an output signal V0 is obtained by using a power stage circuit including a buffer (BUF), two triodes, output inductors L1, L2, L3, and L4, and an output capacitor C0. A 16-phase parallel BUCK is used as an example. Similar to the 4-phase parallel BUCK, the 16-phase parallel BUCK also shares an output of an EA.

During actual layout of a circuit floor plan (floorplan), in one solution, a layout position of an EA is disposed at a center position of a die, and to reduce a delay to a power stage circuit, COMPs are disposed as close as possible to the power stage circuit. As shown in FIG. 2, a layout floor plan in which a 16-phase parallel DCDC circuit is extended by using an EA is provided. In FIG. 2, every two 1-phase power stage circuits form a group, each 1-phase power stage circuit is connected to a COMP, and the COMP is close to the corresponding power stage circuit. In another solution shown in FIG. 3, a layout position of an EA is disposed at a center position of a die, 16 COMPs are separately disposed around the EA, and each of the COMPs is connected to a corresponding 1-phase power stage circuit through a long trace.

In the solution in FIG. 2, if a die has a size of 4 mm*4 mm, it means a trace of VEAOUT needs to be at least 8 millimeters (mm). For an output of the EA, a longer trace layout indicates a larger parasitic capacitance and a larger parasitic resistance thereon, causing a lower frequency of a parasitic pole. Therefore, a high loop bandwidth design is greatly affected, and consequently a loop transient response is deteriorated. Particularly, when a quantity of parallel phases becomes larger, an area of a die becomes larger, and both a trace length and parasitics of the EA are increased. In a solution in FIG. 3, if a die has a size of 4 mm*4 mm, it means an output trace of each COMP needs to be at least 2 mm. For an output of the COMP, a longer trace layout indicates a larger parasitic capacitance and a larger parasitic resistance thereon, causing a lower frequency of a parasitic pole. Therefore, a loop delay is greatly affected, resulting in an increase in an overshoot or an undershoot during a transient response, and consequently the loop transient response is deteriorated.

SUMMARY

This application provides a multiphase parallel DCDC circuit and a chip structure thereof, to reduce output parasitics of a loop operational amplifier EA unit and a COMP, thereby increasing a loop bandwidth and speed of a transient response.

A first aspect of this application provides a multiphase parallel DCDC circuit, including a loop operational amplifier EA unit, N output-stage circuit units, and M drive units, where a drive unit corresponds to at least one output-stage circuit unit, the output-stage circuit unit includes a COMP and a power stage circuit, N is an integer greater than or equal to 2, and M is an integer less than or equal to N, an output end of the loop operational amplifier EA unit is connected to an input end of the drive unit, an output end of the drive unit is connected to an input end of a COMP in a corresponding output-stage circuit unit, and an output end of the COMP is connected to an input end of a power stage circuit in the same output-stage circuit unit, and an input end of the loop operational amplifier EA is connected to output ends of all the power stage circuits.

The multiphase parallel DCDC circuit includes the loop operational amplifier EA unit, the N output-stage circuit units, and the M drive units. A drive unit corresponds to at least one output-stage circuit unit, the output-stage circuit unit includes the COMP and the power stage circuit, N is an integer greater than or equal to 2, and M is an integer less than or equal to N. This indicates that a drive unit can drive one or more COMPS, and a quantity of phases is determined by a value of N. Because the output end of the loop operational amplifier EA unit is connected to the input end of the drive unit, and the output end of the drive unit is connected to the input end of the COMP in the corresponding output-stage circuit unit, after an output voltage of the loop operational amplifier EA unit passes through the drive unit, an output voltage of the drive unit drives the COMP. The input end of the loop operational amplifier EA is connected to the output ends of all the power stage circuits, to form a loop structure circuit. The multiphase parallel DCDC circuit inevitably reduces a length of an output trace of the loop operational amplifier EA unit, and decreases a parasitic capacitance and a parasitic resistance of the output trace of the loop operational amplifier EA unit. Due to existence of the drive unit, the COMP may be disposed close to the power stage circuit without considering disposing the COMP close to the loop operational amplifier EA unit, to reduce the parasitic capacitance and the parasitic resistance of the output trace of the COMP. Because a larger parasitic capacitance and a larger parasitic resistance cause a lower frequency of a parasitic pole, a high loop bandwidth design is greatly affected, and a loop transient response is deteriorated. Therefore, in this application, the output parasitic capacitance and the output parasitic resistance of the loop operational amplifier EA unit and the COMP are reduced, thereby increasing a loop bandwidth and speed of a transient response.

With reference to the first aspect of this application, in a first implementation of the first aspect of this application, a negative end of the drive unit is connected to the output end of the drive unit, and a positive end of the drive unit is connected to the output end of the loop operational amplifier EA unit.

The drive unit may be an EA, the negative end is connected to the output end, and the positive end is connected to the output end of the loop operational amplifier EA unit such that a negative feedback is formed between the negative end and the output end of the EA, to provide a drive effect on an output voltage that is output by the operational amplifier EA unit and that is received by the positive end, to ensure that an output voltage output by the output end of the drive unit to the COMP is consistent with the output voltage of the operational amplifier EA unit.

With reference to the first implementation of the first aspect of this application, in a second implementation of the first aspect of this application, the power stage circuit includes two BUFs, a lower power transistor, an upper power transistor, an output inductor, and an output capacitor, a negative end of the COMP is connected to the output end of the drive unit, and a positive end of the COMP is connected to a triangular wave signal end such that the output end of the COMP outputs a square voltage signal having a predetermined duty cycle, and input ends of the two BUFs are separately connected to the output end of the COMP, output ends of the two BUFs are respectively connected to a gate of the lower power transistor and a gate of the upper power transistor, a source of the upper power transistor is connected to a power supply end, a source of the lower power transistor is connected to a ground end, a drain of the lower power transistor and a drain of the upper power transistor are connected to one end of the output inductor, the other end of the output inductor is connected to a non-ground end of the output capacitor, and the other end of the output capacitor is grounded.

For the output-stage circuit unit, a BUCK circuit may be used as an example. Based on a circuit structure of a known BUCK circuit, a power stage circuit in the output-stage circuit units includes two BUFs, a lower power transistor, an upper power transistor, an output inductor, and an output capacitor, a negative end of a COMP is connected to an output end of a drive unit, and a positive end of the COMP is connected to a triangular wave signal end. For a voltage waveform that is in a form of a triangular wave and that is provided by the triangular wave signal end, an objective is to enable the COMP to output a square voltage signal having a predetermined duty cycle at an output end of the COMP based on the triangular wave signal and an output signal output by the drive unit. A value of the duty cycle is determined by both the preset triangular wave signal and the output signal output by the drive unit. Input ends of the two BUFs are separately connected to the output end of the COMP, and the BUF provides a drive effect. Output ends of the two BUFs are respectively connected to a gate of the lower power transistor and a gate of the upper power transistor, a source of the upper power transistor is connected to a power supply end, a source of the lower power transistor is connected to a ground end, a drain of the lower power transistor and a drain of the upper power transistor are connected to one end of the output inductor, the other end of the output inductor is connected to a non-ground end of the output capacitor, and the other end of the output capacitor is grounded. In addition, signals output by multiple power stage circuits are combined into one signal by using the output inductor and the output capacitor, to supply power to a load.

With reference to the second implementation of the first aspect of this application, in a third implementation of the first aspect of this application, the loop operational amplifier EA unit includes a feedback compensation network and a loop operational amplifier EA, a first port of the feedback compensation network is connected to a negative end of the loop operational amplifier EA, a second port of the feedback compensation network is connected to the non-ground end of the output capacitor of the power stage circuit, a third port of the feedback compensation network is connected to an output end of the loop operational amplifier EA, and a positive end of the loop operational amplifier EA is connected to a reference voltage end.

The loop operational amplifier EA unit includes the feedback compensation network and the loop operational amplifier EA, the first port of the feedback compensation network is connected to the negative end of the loop operational amplifier EA, the second port of the feedback compensation network is connected to the non-ground end of the output capacitor, a third port of the feedback compensation network is connected to the output end of the loop operational amplifier EA, and the positive end of the loop operational amplifier EA is connected to the reference voltage end. The feedback compensation network receives, by using the second port, a signal obtained after output voltages of all the power stage circuits are combined, and receives an output voltage of the loop operational amplifier EA by using the first port. The third port inputs a feedback voltage to the loop operational amplifier EA, and the loop operational amplifier EA outputs a difference conversion voltage based on the feedback voltage at the negative end and a reference voltage at the positive end.

With reference to the third implementation of the first aspect of this application, in a fourth implementation of the first aspect of this application, the feedback compensation network includes, after being connected in series to a first capacitor, a first resistor is further connected in parallel to a second resistor, a connection point between the first resistor and the second resistor is the second port, and a connection point between the second resistor and the first capacitor is the first port, after being connected in series to a second capacitor, a third resistor is further connected in parallel to a third capacitor, a connection point between the third resistor and the third capacitor is connected to the first port, and a connection point between the second capacitor and the third capacitor is the third port, and one end of a fourth resistor is connected to the first port, and the other end of the fourth resistor is connected to the ground end.

The feedback compensation network includes the first resistor, the second resistor, the third resistor, the fourth resistor, the first capacitor, the second capacitor, and the third capacitor. After being connected in series to the first capacitor, the first resistor is further connected in parallel to the second resistor, the connection point between the first resistor and the second resistor is the second port, and the connection point between the second resistor and the first capacitor is the first port. After being connected in series to the second capacitor, the third resistor is further connected in parallel to the third capacitor, the connection point between the third resistor and the third capacitor is connected to the first port, and the connection point between the second capacitor and the third resistor is the third port. The one end of the fourth resistor is connected to the first port, and the other end of the fourth resistor is connected to the ground end. The output voltage of the loop operational amplifier EA is adjusted by using a feedback compensation effect of the feedback compensation network.

A second aspect of this application provides a chip structure of a multiphase parallel DCDC circuit, including a loop operational amplifier EA unit, N output-stage circuit units, and M drive units that are disposed on a chip die, where a drive unit corresponds to at least one output-stage circuit unit, the output-stage circuit unit includes a COMP and a power stage circuit, N is an integer greater than or equal to 2, and M is an integer less than or equal to N, an output end of the loop operational amplifier EA unit is connected to an input end of the drive unit through a trace on the chip die, an output end of the drive unit is connected to an input end of a COMP in a corresponding output-stage circuit unit through a trace on the chip die, and an output end of the COMP is connected to an input end of a power stage circuit in the same output-stage circuit unit through a trace on the chip die.

In the chip structure of the multiphase parallel DCDC circuit, the loop operational amplifier EA unit, the N output-stage circuit units, and the M drive units are disposed on the chip die, a drive unit corresponds to at least one output-stage circuit unit, the output-stage circuit unit includes the COMP and the power stage circuit, N is an integer greater than or equal to 2, and M is an integer less than or equal to N. This indicates that a drive unit can drive one or more COMPs, and a quantity of phases is determined by a value of N. The output end of the loop operational amplifier EA unit is connected to the input end of the drive unit through the trace on the chip die, the output end of the drive unit is connected to the input end of the COMP in the corresponding output-stage circuit unit through the trace on the chip die, and the output end of the COMP is connected to the input end of the power stage circuit in the same output-stage circuit unit through the trace on the chip die. After an output voltage of the loop operational amplifier EA unit passes through the drive unit, an output voltage of the drive unit drives the COMP. The multiphase parallel DCDC circuit inevitably reduces a length of an output trace of the loop operational amplifier EA unit, and decreases a parasitic capacitance and a parasitic resistance of the output trace of the loop operational amplifier EA unit. Due to existence of the drive unit, the COMP may be disposed close to the power stage circuit without considering disposing the COMP close to the loop operational amplifier EA unit, to reduce the parasitic capacitance and the parasitic resistance of the output trace of the COMP. Because a larger parasitic capacitance and a larger parasitic resistance cause a lower frequency of a parasitic pole, a high loop bandwidth design is greatly affected, and a loop transient response is deteriorated. Therefore, in this application, the output parasitic capacitance and the output parasitic resistance of the loop operational amplifier EA unit and the COMP are reduced, thereby increasing a loop bandwidth and speed of a transient response.

With reference to the second aspect of this application, in a first implementation of the second aspect of this application, the loop operational amplifier EA unit is disposed at a center position of the chip die, the M drive units are disposed around the loop operational amplifier EA unit, the power stage circuit is disposed at an edge position of the chip die, and the COMP corresponding to the power stage circuit is disposed close to the power stage circuit.

In an embodiment of a chip structure of the multiphase parallel DCDC circuit, for convenience of trace arrangement, the loop operational amplifier EA unit is usually disposed at the center position of the chip die, the M drive units are disposed around the loop operational amplifier EA unit, the power stage circuit is disposed at the edge position of the chip die, and the COMP corresponding to the power stage circuit is disposed close to the power stage circuit.

With reference to the first implementation of the second aspect of this application, in a second implementation of the second aspect of this application, the power stage circuits corresponding to the drive units in the output-stage circuit units are integrated into a power stage unit, and the power stage unit is disposed at the edge position of the chip die.

In the chip structure, for convenience of laying out and manufacturing, all the power stage circuits corresponding to the drive units in output-stage circuit units are integrated into a power stage unit, the a drive unit may correspond to one or more output-stage circuit units such that trace arrangement is more convenient when there are a large quantity of output-stage circuit units.

With reference to the second aspect of this application, in a third implementation of the second aspect of this application, the drive unit is an EA, a negative end of the drive unit is connected to the output end of the drive unit, and a positive end of the drive unit is connected to the output end of the loop operational amplifier EA unit.

The drive unit may be an EA during implementation, the negative end is connected to the output end, and the positive end is connected to the output end of the loop operational amplifier EA unit such that a negative feedback is formed between the negative end and the output end of the EA, to provide a drive effect on an output voltage that is output by the operational amplifier EA unit and that is received by the positive end, to ensure that an output voltage output by the output end of the drive unit to the COMP is consistent with the output voltage of the loop operational amplifier EA unit.

With reference to the second aspect, the first implementation of the second aspect, the second implementation of the second aspect, or the third implementation of the second aspect of this application, in a fourth implementation of the second aspect of this application, the chip die is a circular silicon chip or a square silicon chip.

In a chip structure of the multiphase parallel DCDC circuit, the chip die is usually a circular silicon chip or a square silicon chip.

BRIEF DESCRIPTION OF DRAWINGS

To describe the technical solutions in embodiments of this application more clearly, the following briefly describes the accompanying drawings required for describing the embodiments.

DESCRIPTION OF EMBODIMENTS

This application provides a multiphase parallel DCDC circuit and a chip structure thereof to reduce output parasitics of a loop operational amplifier EA unit and a COMP, thereby increasing a loop bandwidth and speed of a transient response.

The technical solutions in this application are clearly described below with reference to the accompanying drawings.

Figure 4:
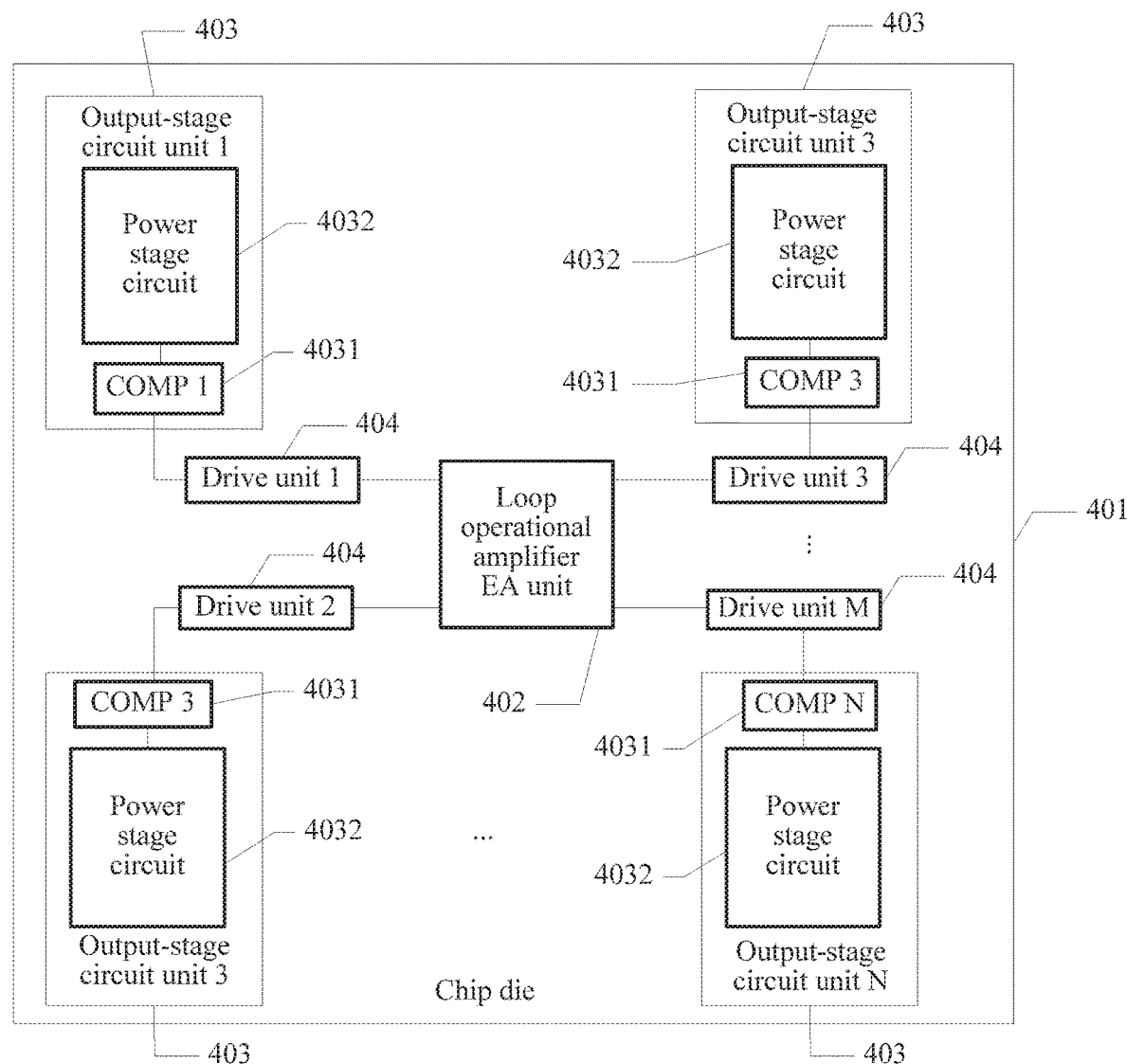
FIG. 4 is a schematic structural diagram of a chip structure of a multiphase parallel DCDC circuit according to this application.

Referring to FIG. 4, FIG. 4 shows a chip structure of a multiphase parallel DCDC circuit according to an embodiment of this application. The chip structure includes a loop operational amplifier EA unit 402, N output-stage circuit units 403, and M drive units 404 that are disposed on a chip die 401, where a drive unit 404 corresponds to at least one output-stage circuit unit 403, the output-stage circuit unit 403 includes a COMP 4031 and a power stage circuit 4032, N is an integer greater than or equal to 2, and M is an integer less than or equal to N, an output end of the loop operational amplifier EA unit 402 is connected to an input end of the drive unit 404 through a trace on the chip die 401, an output end of the drive unit 404 is connected to an input end of a COMP 4031 in a corresponding output-stage circuit unit through a trace on the chip die 401, and an output end of the COMP 4031 is connected to an input end of a power stage circuit 4032 in the same output-stage circuit unit 403 through a trace on the chip die 401.

Figure 2:
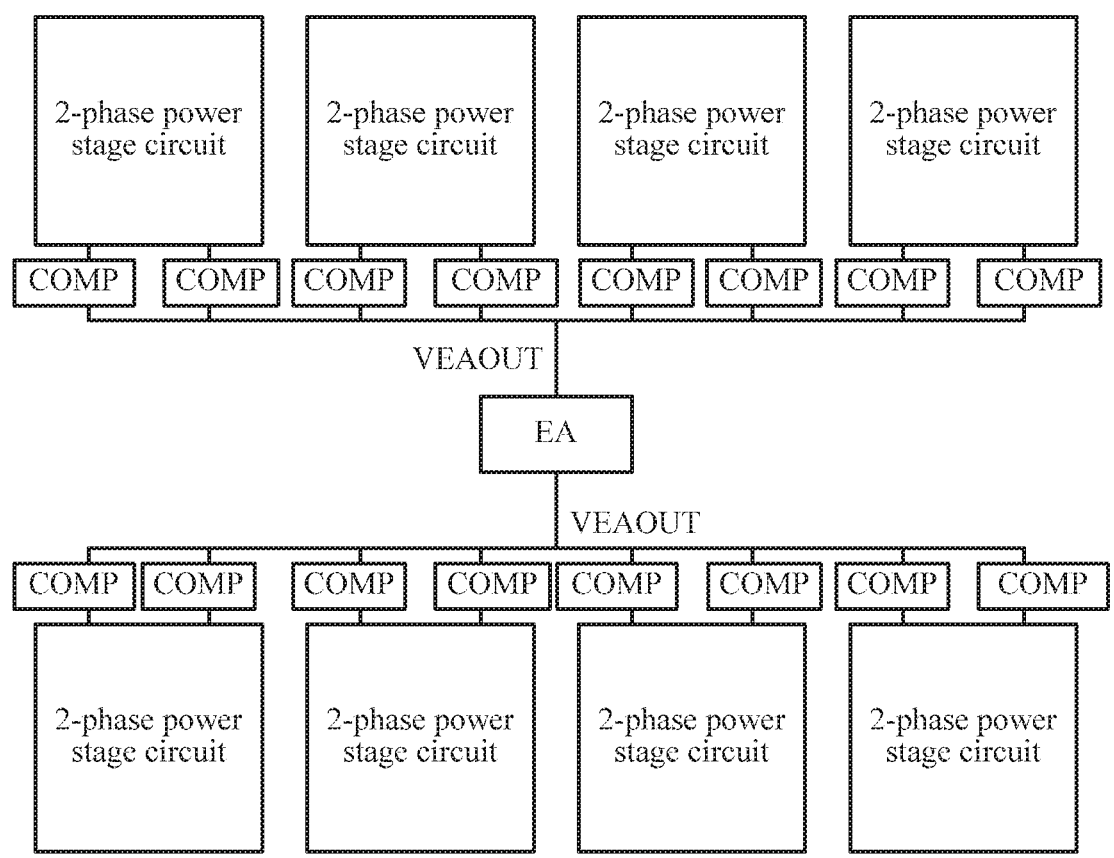
FIG. 2 is a schematic structural diagram of a chip structure of a 16-phase parallel DCDC circuit.
Figure 3:
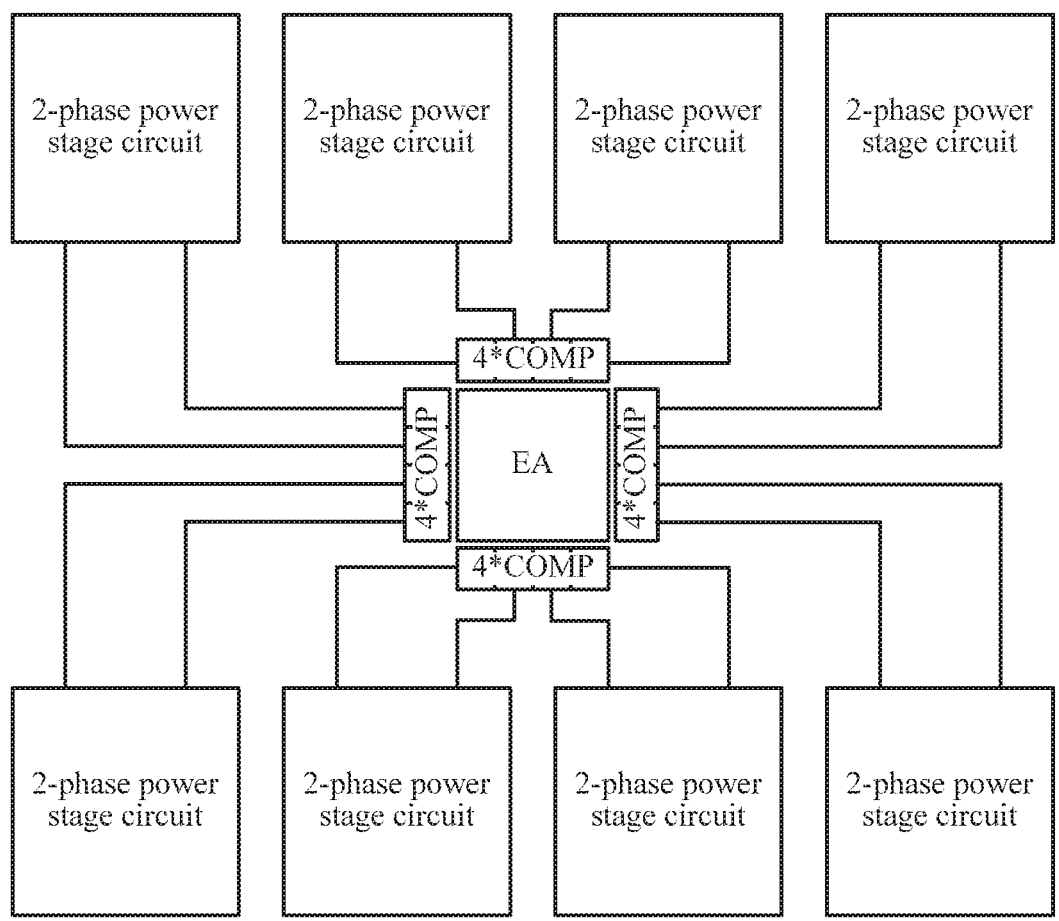
FIG. 3 is a schematic structural diagram of a chip structure of another 16-phase parallel DCDC circuit.

In this embodiment of this application, in the chip structure shown in FIG. 4, the loop operational amplifier EA unit 402 is connected to all the M drive units 404, N is an integer greater than or equal to 2, and M is an integer less than or equal to N. Therefore, a drive unit 404 certainly corresponds to at least one output-stage circuit unit 403, the output end of the loop operational amplifier EA unit 402 is connected to the input end of the drive unit 404 through the trace on the chip die 401, the output end of the drive unit 404 is connected to the input end of the COMP 4031 in the corresponding output-stage circuit unit 403 through the trace on the chip die 401, and the output end of the COMP 4031 is connected to the input end of the power stage circuit 4032 in the same output-stage circuit unit 403 through the trace on the chip die 401. After an output voltage of the loop operational amplifier EA unit 402 passes through the drive unit 404, an output voltage of the drive unit 404 drives the COMP 4031. Compared with a chip structure in FIG. 2 in which the output end of the loop operational amplifier EA unit 402 is directly connected to input ends of all the COMPs 4031 rather than by using the drive units 404, instead of being directly connected to the input ends of all the COMPs 4031, the chip structure of a multiphase parallel DCDC circuit inevitably reduces a length of an output trace of the loop operational amplifier EA unit 402, and decreases a parasitic capacitance and a parasitic resistance of the output trace of the loop operational amplifier EA unit 402. Compared with a chip structure shown in FIG. 3, due to existence of the drive unit 404, the COMP 4031 may be disposed close to the power stage circuit 4032 without considering disposing the COMP 4031 close to the loop operational amplifier EA unit 402, to reduce the parasitic capacitance and the parasitic resistance of an output trace of the COMP 4031. Because a larger parasitic capacitance and a larger parasitic resistance cause a lower frequency of a parasitic pole, a high loop bandwidth design is greatly affected, and a loop transient response is deteriorated. Therefore, in this application, the output parasitic capacitance and the output parasitic resistance of the loop operational amplifier EA unit 402 and the COMP 4031 are reduced, thereby increasing a loop bandwidth and speed of a transient response.

Optionally, in some embodiments of this application, the loop operational amplifier EA unit 402 is disposed at a center position of the chip die 401, the M drive units 404 are disposed around the loop operational amplifier EA unit 402, the power stage circuit 4032 is disposed at an edge position of the chip die 401, and the COMP 4031 corresponding to the power stage circuit 4032 is disposed close to the power stage circuit 4032.

In this embodiment of this application, in a chip structure of the multiphase parallel DCDC circuit, for convenience of trace arrangement, the loop operational amplifier EA unit 402 is usually disposed at the center position of the chip die 401, the M drive units 404 are disposed around the loop operational amplifier EA unit 402, the power stage circuit 4032 is disposed at the edge position of the chip die 401, and the COMP 4031 corresponding to the power stage circuit 4032 is disposed close to the power stage circuit. Based on a drive function of the drive unit 404, the drive unit 404 only needs to be disposed close and connected to the loop operational amplifier EA unit 402 such that the output trace of the loop operational amplifier EA unit 402 is very short, and trace parasitics can be reduced. In addition, the COMP 4031 may be disposed close to the power stage circuit 4032 such that output trace of the COMP 4031 may be very short, and trace parasitics are further reduced, thereby better increasing the loop bandwidth and speed of the transient response.

Figure 5:
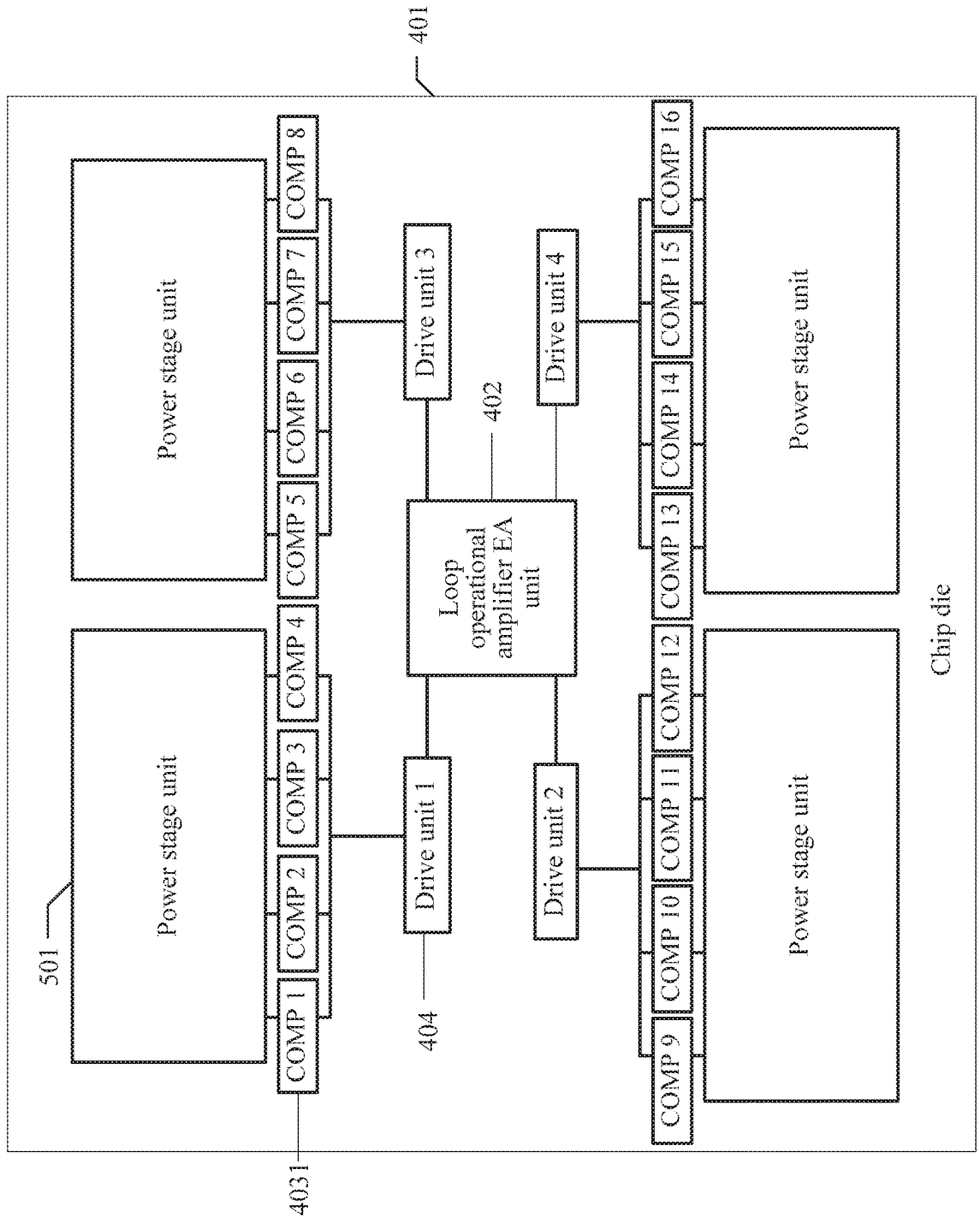
FIG. 5 is a schematic structural diagram of a chip structure of another multiphase parallel DCDC circuit according to this application.

Optionally, as shown in FIG. 5, in some embodiments of this application, the power stage circuits 4032 corresponding to the drive units 404 are integrated into a power stage unit 501, and the power stage unit 501 is disposed at the edge position of the chip die 401.

Figure 6:
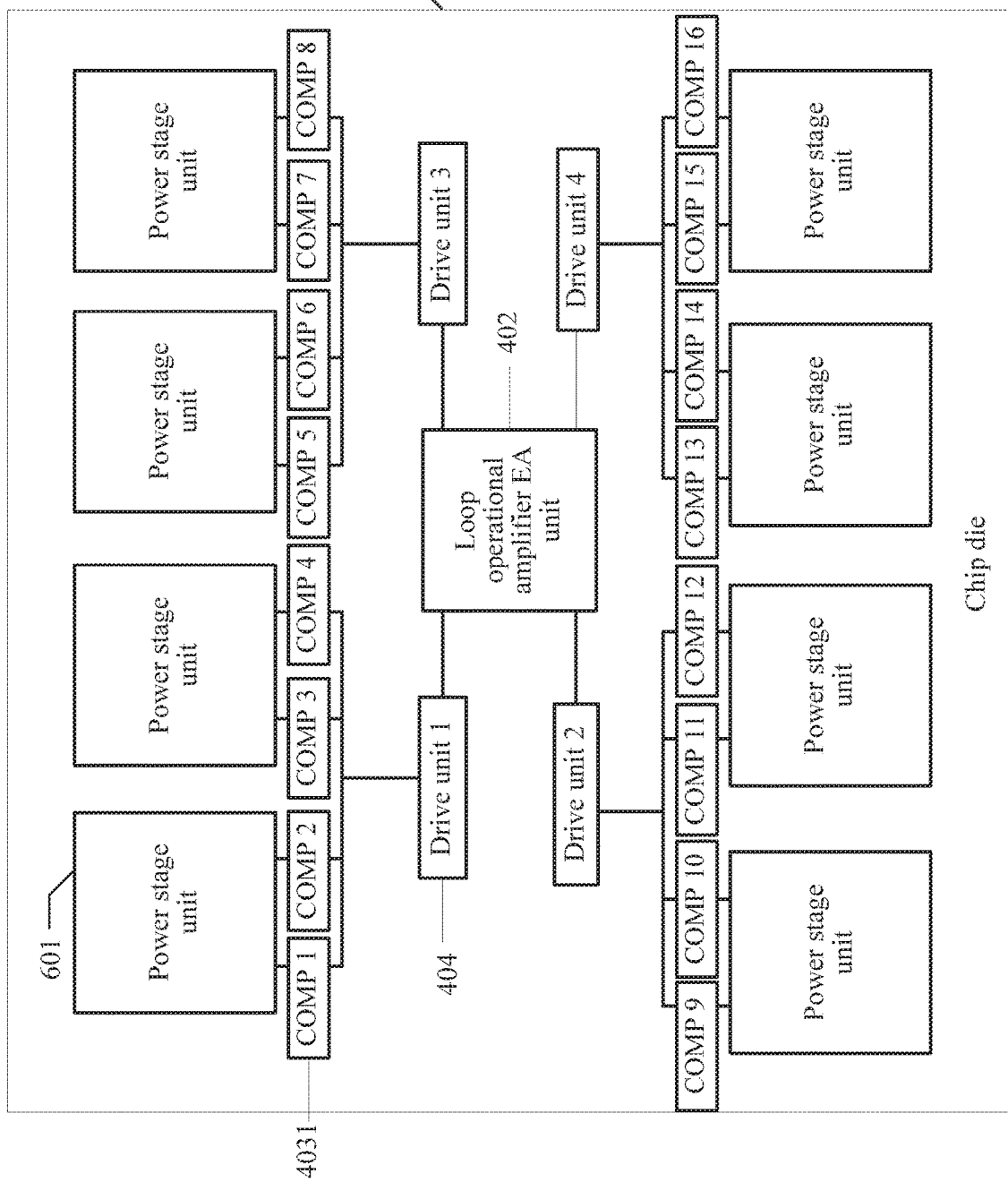
FIG. 6 is a schematic structural diagram of a chip structure of still another multiphase parallel DCDC circuit according to this application.

In this embodiment of this application, as shown in FIG. 5, a quantity N of output-stage circuit units is 16, and a quantity M of the drive units 404 is 4. An example in which a drive unit 404 corresponds to four output-stage circuit units is used such that the drive unit 404 is connected to four COMPs, and power stage circuits corresponding to the four COMPs are integrated into one power stage unit 501. For convenience of trace arrangement, the power stage unit 501 is disposed at an outer edge position of the chip die 401. In addition, as shown in FIG. 6, two power stage circuits may be integrated into one power stage unit 601.

Optionally, in some embodiments of this application, the drive unit 404 is an EA, a negative end of the drive unit 404 is connected to the output end of the drive unit 404, and a positive end of the drive unit 404 is connected to the output end of the loop operational amplifier EA unit 402.

In this embodiment of this application, during implementation, the drive unit 404 may be an EA, the negative end of the drive unit 404 is connected to the output end, and the positive end is connected to the output end of the loop operational amplifier EA unit 402 such that a negative feedback is formed between the negative end and the output end of the EA, to provide a drive effect on an output voltage that is output by the loop operational amplifier EA unit 402 and that is received by the positive end, to ensure that an output voltage output by the output end of the drive unit to the COMP 4031 is consistent with the output voltage of the loop operational amplifier EA unit 402.

Optionally, in some embodiments of this application, the chip die 401 is a circular silicon chip or a square silicon chip.

In this embodiment of this application, during manufacturing of a chip structure of the multiphase parallel DCDC circuit, a circular silicon chip or a square silicon chip is usually used. Assuming that there is a small quantity of power stage circuits, a 4*4 mm square silicon chip may be used. If a quantity of the power stage circuits is increased, a size of a chip die needs to be appropriately increased.

The chip structure of the multiphase parallel DCDC circuit in this application is described in the foregoing embodiments, and a multiphase parallel DCDC circuit in the chip structure is described in detail below by using embodiments.

Figure 7:
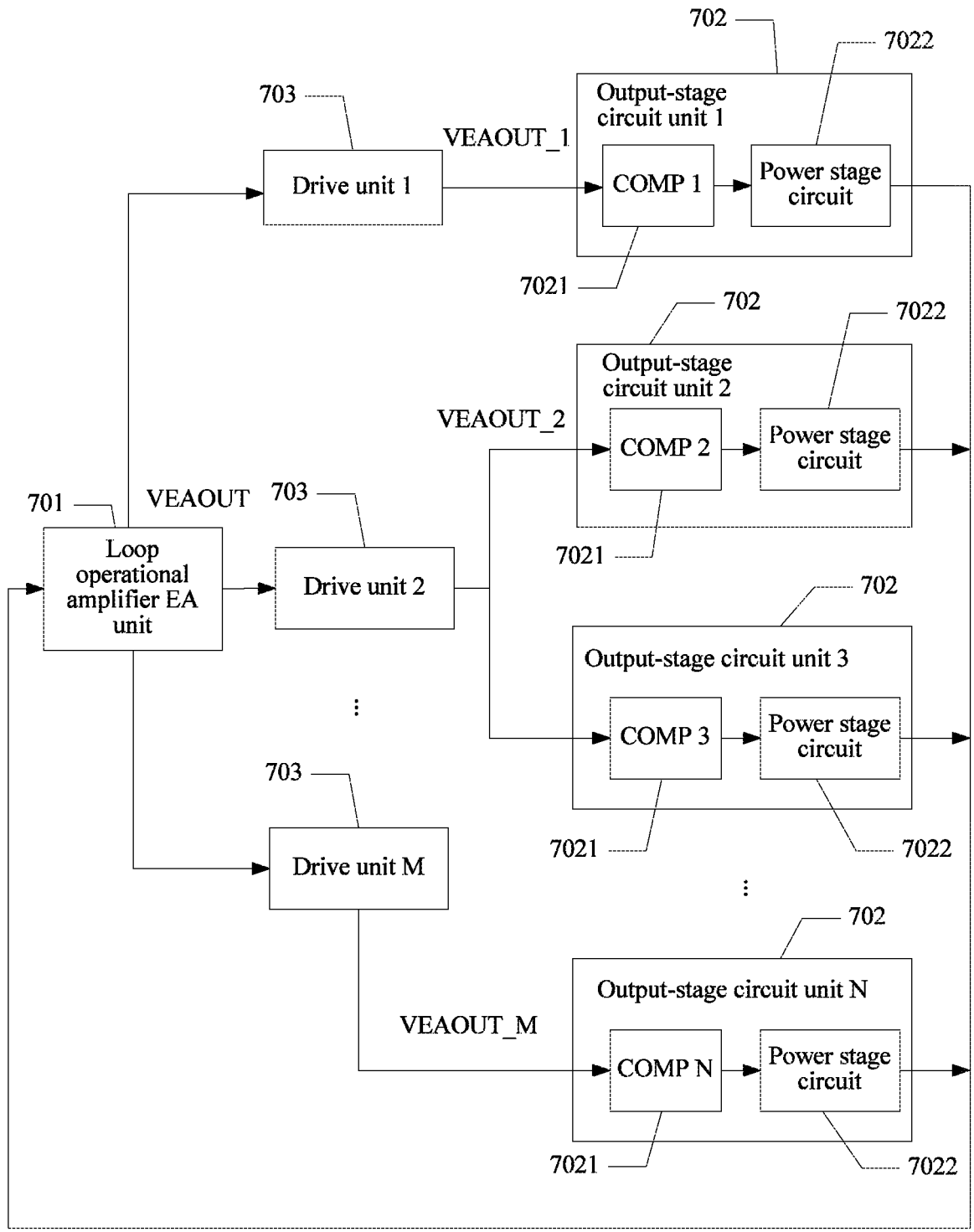
FIG. 7 is a schematic diagram of a circuit structure of a multiphase parallel DCDC circuit according to this application.

Referring to FIG. 7, an embodiment of this application provides a multiphase parallel DCDC circuit, including a loop operational amplifier EA unit 701, N output-stage circuit units 702, and M drive units 703, where a drive unit 703 corresponds to at least one output-stage circuit unit 702, the output-stage circuit unit 702 includes a COMP 7021 and a power stage circuit 7022, N is an integer greater than or equal to 2, and M is an integer less than or equal to N, an output end of the loop operational amplifier EA unit 701 is connected to an input end of the drive unit 703, an output end of the drive unit 703 is connected to an input end of a COMP 7021 in a corresponding output-stage circuit unit 702, and an output end of the COMP 7021 is connected to an input end of a power stage circuit 7022 in the same output-stage circuit unit, and an input end of the loop operational amplifier EA unit 701 is connected to output ends of all the power stage circuits 7022.

Figure 1:
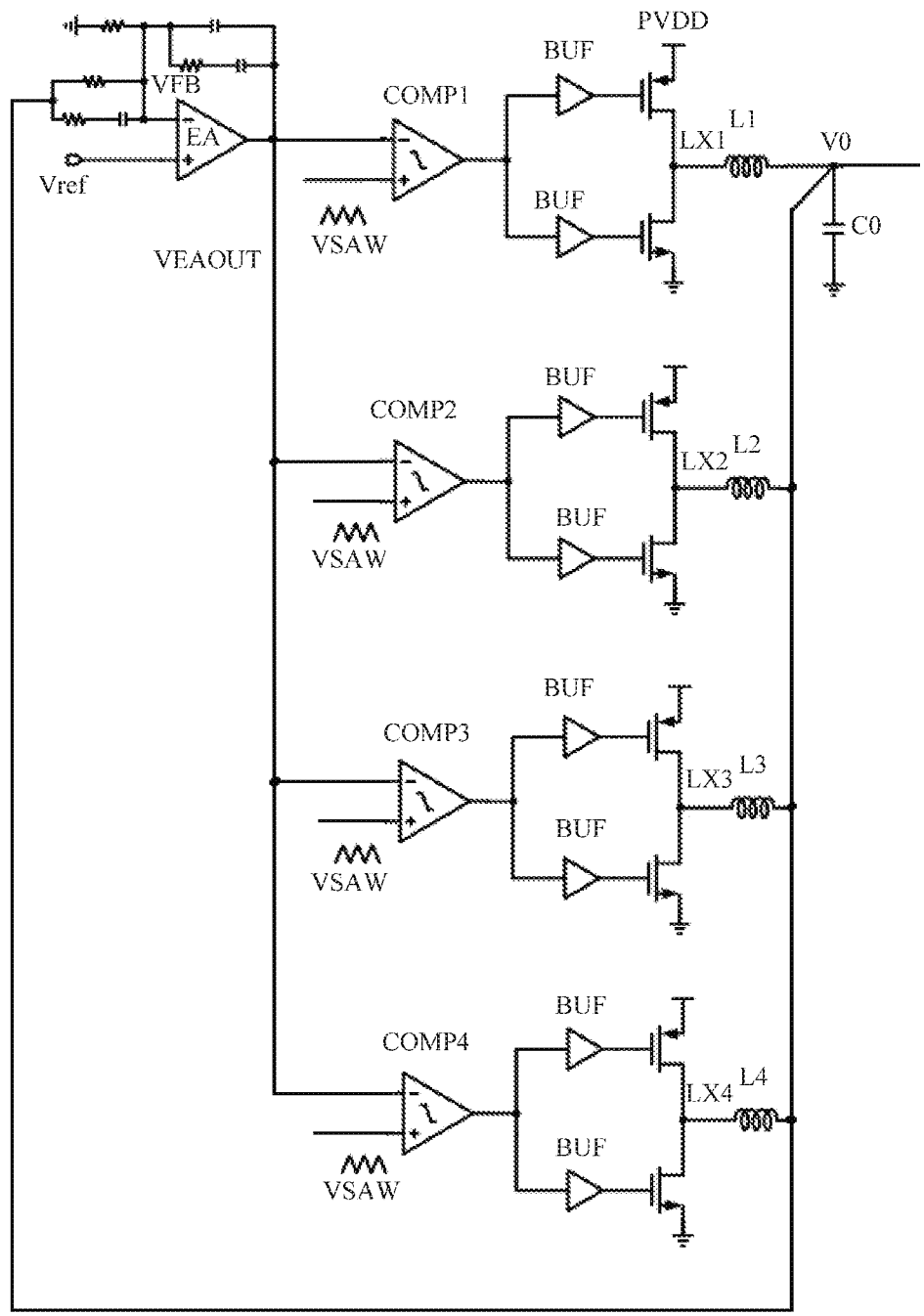
FIG. 1 is a schematic diagram of a circuit structure of a 4-phase parallel BUCK circuit.

The multiphase parallel DCDC circuit includes the loop operational amplifier EA unit 701, the N output-stage circuit units 702, and the M drive units 703. A drive unit 703 corresponds to at least one output-stage circuit unit 702. For example, a drive unit 1 corresponds to an output-stage circuit unit 1, a drive unit 2 corresponds to output-stage circuit units 2 and 3. The output-stage circuit unit 702 includes the COMP 7021 and the power stage circuit 7022. Because the output end of the loop operational amplifier EA unit 701 is connected to the input end of the drive unit 703, and the output end of the drive unit 703 is connected to the input end of the COMP 7021 in the corresponding output-stage circuit unit 702, after passing through the drive unit 703, an output voltage VEAOUT of the loop operational amplifier EA unit 701 then drives the COMP 7021 by using an output voltage VEAOUT_M of the drive unit. The input end of the loop operational amplifier EA unit 701 is connected to the output ends of all the power stage circuits 7022, to form a loop structure circuit. Compared with the multiphase parallel BUCK circuit shown in FIG. 1 in which the output end of the loop operational amplifier EA unit 701 is directly connected to input ends of all the COMPs 7021 rather than by using the drive units 703, the multiphase parallel DCDC circuit inevitably reduces a length of an output trace of the loop operational amplifier EA unit 701 in a chip of the multiphase parallel DCDC circuit, and decreases a parasitic capacitance and a parasitic resistance of the output trace of the loop operational amplifier EA unit 701. Due to existence of the drive unit 703, the COMP 7021 may be disposed close to the power stage circuit without considering disposing the COMP 7021 close to the loop operational amplifier EA unit 701, to reduce the parasitic capacitance and the parasitic resistance of the output trace of the COMP 7021. Because a larger parasitic capacitance and a larger parasitic resistance cause a lower frequency of a parasitic pole, a high loop bandwidth design is greatly affected, and a loop transient response is deteriorated. Therefore, in this application, the output parasitic capacitance and the output parasitic resistance of the loop operational amplifier EA unit 701 and the COMP 7021 are reduced, thereby increasing a loop bandwidth and speed of a transient response.

Figure 8:
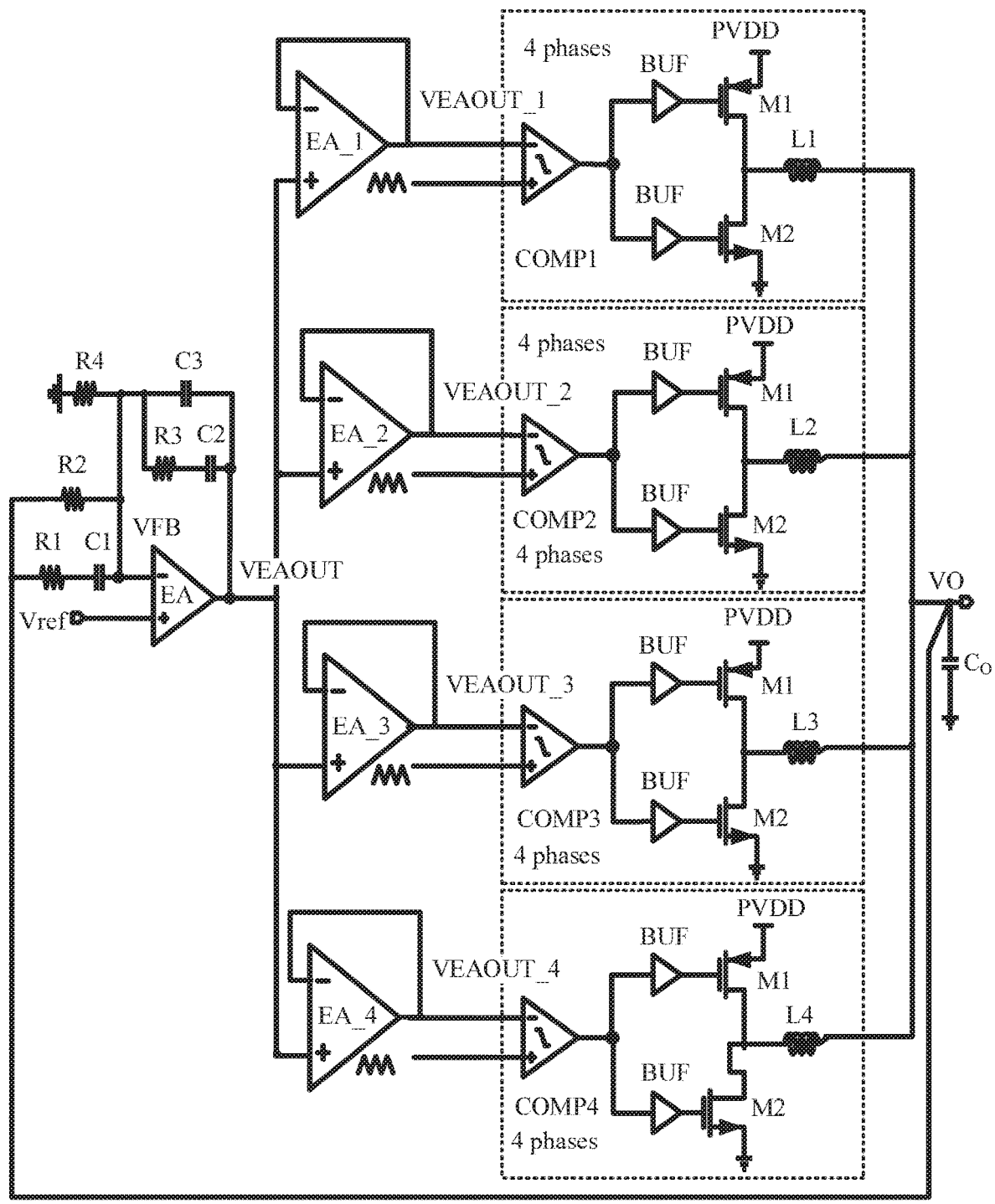
FIG. 8 is a schematic diagram of a circuit structure of a 16-phase parallel DCDC circuit according to this application.

Optionally, as shown in FIG. 8, in some embodiments of this application, a negative end of the drive unit is connected to the output end of the drive unit, and a positive end of the drive unit is connected to the output end of the loop operational amplifier EA unit.

In this embodiment of this application, the drive unit is implemented by using an EA, a negative end and an output end of each of an EA_1 to an EA_4 are connected, and a positive end of each of the EA_1 to the EA_4 is connected to the output end of the loop operational amplifier EA unit such that a negative feedback is formed between the negative end and the output end of the EA, to provide a drive effect on an output voltage that is output by the operational amplifier EA unit and that is received by the positive end, to ensure that an output voltage VEAOUT_1 output by the output end of the drive unit to the COMP is consistent with the output voltage VEAOUT of the operational amplifier EA unit. It should be noted that the drive unit may alternatively be implemented by using other circuit components or circuit structures in addition to the EA. This is not specifically limited.

It should be noted that, in FIG. 8, each of the drive units EA_1, EA_2, EA_3, and EA_4 corresponds to four output-stage circuit units, indicating that FIG. 8 shows a 16-phase parallel DCDC circuit. During actual application, a drive unit may further correspond to another quantity of output-stage circuit units, and quantities are different. This is not specifically limited.

Optionally, as shown in FIG. 8, in some embodiments of this application, the power stage circuit includes two BUFs, an upper power transistor M1, a lower power transistor M2, an output inductor, and an output capacitor, a negative end of the COMP is connected to the output end of the drive unit, and a positive end of the COMP is connected to a triangular wave signal end such that the output end of the COMP outputs a square voltage signal having a predetermined duty cycle, and input ends of the two BUFs are separately connected to the output end of the COMP, output ends of the two BUFs are respectively connected to a gate of the upper power transistor M1 and a gate of the lower power transistor M2, a source of the upper power transistor M1 is connected to a power supply end PVDD, a source of the lower power transistor M2 is connected to a ground end, a drain of the upper power transistor M1 and a drain of the lower power transistor M2 is connected to one end of the output inductor, the other end of the output inductor is connected to a non-ground end of the output capacitor, and the other end of the output capacitor is grounded.

In this embodiment of this application, in the circuit shown in FIG. 8, for the output-stage circuit unit, a BUCK circuit is used as an example. Based on a circuit structure of a known BUCK circuit, in a first output-stage circuit unit, a negative end of a COMP 1 is connected to an output end of a drive unit, and a positive end of the COMP is connected to a triangular wave signal end. For a voltage waveform that is in a form of a triangular wave and that is provided by the triangular wave signal end, an objective is to enable the COMP 1 to output a square voltage signal having a predetermined duty cycle at an output end of the COMP 1 based on the triangular wave signal and an output signal VEAOUT_1 output by the drive unit. The predetermined duty cycle is determined by both the preset triangular wave signal and the VEAOUT_1. An input end of each of the two BUFs is connected to the output end of the COMP, and the BUF provides a drive effect. When an upper power transistor M1 is turned on, a lower power transistor M2 is turned off, or when a lower power transistor M2 is turned on, an upper power transistor M1 is turned off. Similarly, connections between components in another output-stage circuit unit are the same as those in the first output-stage circuit unit. One end of an output capacitor C0 connected to output inductors L1, L2, L3, and L4 is grounded such that signals output by multiple power stage circuits can be combined into one signal by using the output inductors L1, L2, L3, and L4, and the output capacitor C0, and the signal is fed back to a negative end of a loop operational amplifier EA.

It should be noted that in the multiphase parallel DCDC circuit, the output-stage circuit unit may further be another type of circuit in addition to the BUCK type circuit. This is not specifically limited.

Optionally, as shown in FIG. 8, in some embodiments of this application, the loop operational amplifier EA unit includes a feedback compensation network and a loop operational amplifier EA, a first port of the feedback compensation network is connected to the negative end of the loop operational amplifier EA, a second port of the feedback compensation network is connected to the non-ground end of the output capacitor of the power stage circuit, a third port of the feedback compensation network is connected to an output end of the loop operational amplifier EA, and a positive end of the loop operational amplifier EA is connected to a reference voltage end Vref.

The feedback compensation network is, after being connected in series to a first capacitor C1, a first resistor R1 is further connected in parallel to a second resistor R2, a connection point between the first resistor R1 and the second resistor R2 is the second port, and a connection point between the second resistor R2 and the first capacitor C1 is the first port, after being connected in series to a second capacitor C2, a third resistor R3 is further connected in parallel to a third capacitor C3, a connection point between the third resistor R3 and the third capacitor C3 is connected to the first port, and a connection point between the second capacitor C2 and the third capacitor C3 is a third port, and one end of a fourth resistor R4 is connected to the first port, and the other end is connected to the ground end.

The loop operational amplifier EA unit includes the feedback compensation network and the loop operational amplifier EA. The first port of the feedback compensation network is connected to the negative end of the loop operational amplifier EA, the second port of the feedback compensation network is connected to the non-ground end of the output capacitor C0 of the power stage circuit, the third port of the feedback compensation network is connected to the output end of the loop operational amplifier EA, and the positive end of the loop operational amplifier EA is connected to the reference voltage end Vref. The feedback compensation network receives output voltages of all the power stage circuits by using the second port, and receives an output voltage of the loop operational amplifier EA by using the first port, the third port inputs a feedback voltage VFB to the loop operational amplifier EA, and the loop operational amplifier EA outputs a difference conversion voltage VEAOUT based on the feedback voltage VFB at the negative end and a reference voltage Vref at the positive end. In addition, the feedback compensation network includes the first resistor R1, the second resistor R2, the third resistor R3, the fourth resistor R4, the first capacitor C1, the second capacitor C2, and the third capacitor C3. After being connected in series to the first capacitor C1, the first resistor R1 is further connected in parallel to the second resistor R2, the connection point between the first resistor R1 and the second resistor R2 is the second port, and the connection point between the second resistor R2 and the first capacitor C1 is the first port. After being connected to the second capacitor C2, the third resistor R3 is further connected in parallel to the third capacitor C3, the connection point between the third resistor R3 and the third capacitor C3 is connected to the first port, and the connection point between the second capacitor C2 and the third capacitor C3 is the third port, and the one end of the fourth resistor R4 is connected to the first port, and the other end is connected to the ground end. The output voltage VEAOUT of the loop operational amplifier EA can be adjusted by using a feedback compensation effect of the feedback compensation network.

It should be noted that the feedback compensation network may alternatively be implemented by using other circuit structures and circuit components. This is not specifically limited.

The foregoing is merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof. In addition, the modifications and replacements do not make the essence of the corresponding technical solutions depart from the scope of the technical solutions of the embodiments of this application.

The invention claimed is:

1. A multiphase parallel digital current (DC) to DC converter (DCDC) circuit, comprising:
    M drive units, wherein a drive unit of the M drive units corresponds to an output-stage circuit unit;
    N output-stage circuit units, wherein the output-stage circuit unit of the N output-stage circuit units comprises a comparator (COMP) and a power stage circuit, wherein N is an integer greater than or equal to 2, and wherein M is an integer less than or equal to N; and
    a loop operational amplifier error amplifier (EA) unit, wherein an output end of the loop operational amplifier EA unit is connected to an input end of the drive unit,
    wherein an output end of the drive unit is connected to an input end of the COMP in the output-stage circuit unit of the N output-stage circuit units,
    wherein an output end of the COMP is connected to an input end of the power stage circuit in the output-stage circuit unit, and
    wherein an input end of the loop operational amplifier EA unit is connected to output ends of all the power stage circuits.

2. The multiphase parallel DCDC circuit according to claim 1, wherein a negative end of the drive unit is connected to the output end of the drive unit, and a positive end of the drive unit is connected to the output end of the loop operational amplifier EA unit.

3. The multiphase parallel DCDC circuit according to claim 1, wherein the power stage circuit comprises two buffers (BUFs), an upper power transistor, a lower power transistor, an output inductor, and an output capacitor, wherein a negative end of the COMP is connected to the output end of the drive unit, wherein a positive end of the COMP is connected to a triangular wave signal end, wherein the output end of the COMP outputs a square voltage signal having a predetermined duty cycle, wherein input ends of the two BUFs are separately connected to the output end of the COMP, wherein output ends of the two BUFs are respectively connected to a gate of the lower power transistor and a gate of the upper power transistor, wherein a source of the upper power transistor is connected to a power supply end, wherein a source of the lower power transistor is connected to a ground end, wherein a drain of the lower power transistor and a drain of the upper power transistor are connected to one end of the output inductor, wherein another end of the output inductor is connected to a non-ground end of the output capacitor, and wherein another end of the output capacitor is grounded.

4. The multiphase parallel DCDC circuit according to claim 3, wherein the loop operational amplifier EA unit comprises a feedback compensation network and a loop operational amplifier EA, wherein a first port of the feedback compensation network is connected to a negative end of the loop operational amplifier EA, wherein a second port of the feedback compensation network is connected to the non-ground end of the output capacitor of the power stage circuit, wherein a third port of the feedback compensation network is connected to the output end of the loop operational amplifier EA, and wherein a positive end of the loop operational amplifier EA is connected to a reference voltage end.

5. The multiphase parallel DCDC circuit according to claim 4, wherein the feedback compensation network comprises a first resistor, a second resistor, a third resistor, a fourth resistor, a first capacitor, a second capacitor, and a third capacitor, wherein the first resistor is further connected in parallel to the second resistor after being connected in series to the first capacitor, wherein a connection point between the first resistor and the second resistor is the second port, wherein a connection point between the second resistor and the first capacitor is the first port, wherein the third resistor is further connected in parallel to the third capacitor after being connected in series to the second capacitor, wherein a connection point between the third resistor and the third capacitor is connected to the first port, wherein a connection point between the second capacitor and the third capacitor is the third port, wherein one end of the fourth resistor is connected to the first port, and wherein another end of the fourth resistor is connected to a ground end.

6. The multiphase parallel DCDC circuit according to claim 1, wherein the drive unit is an EA.

7. The multiphase parallel DCDC circuit according to claim 1, wherein the loop operational amplifier EA unit is disposed in a center position of a chip die.

8. The multiphase parallel DCDC circuit according to claim 1, wherein the M drive units are disposed around the loop operational amplifier EA unit.

9. A chip structure of a multiphase parallel digital current (DC) to DC converter (DCDC) circuit, comprising:
M drive units disposed on a chip die, wherein a drive unit of the M drive units corresponds to an output-stage circuit unit;
N output-stage circuit units, wherein the output-stage circuit unit comprises a comparator (COMP) and a power stage circuit, wherein N is an integer greater than or equal to 2, and wherein M is an integer less than or equal to N; and
a loop operational amplifier error amplifier (EA) unit, wherein an output end of the loop operational amplifier EA unit is connected to an input end of the drive unit through a trace on the chip die,
wherein an output end of the drive unit is connected to an input end of the COMP in the output-stage circuit unit in the N output-stage circuit units through a trace on the chip die, and
wherein an output end of the COMP is connected to an input end of the power stage circuit in the output-stage circuit unit through a trace on the chip die.

10. The chip structure according to claim 9, wherein the loop operational amplifier EA unit is disposed at a center position of the chip die, wherein the M drive units are disposed around the loop operational amplifier EA unit, wherein the power stage circuit is disposed at an edge of the chip die, and wherein the COMP corresponding to the power stage circuit is disposed close to the power stage circuit.

11. The chip structure according to claim 10, wherein the power stage circuit corresponding to the drive units in the output-stage circuit unit is integrated into a power stage unit, and wherein the power stage unit is disposed at the edge of the chip die.

12. The chip structure according to claim 9, wherein the drive unit is an EA.

13. The chip structure according to claim 9, wherein a negative end of the drive unit is connected to the output end of the drive unit, and wherein a positive end of the drive unit is connected to the output end of the loop operational amplifier EA unit.

14. The chip structure according to claim 9, wherein the chip die is a circular silicon chip.

15. The chip structure according to claim 9, wherein the chip die is a square silicon chip.

16. The chip structure according to claim 9, wherein the power stage circuit comprises two buffers (BUFs), an upper power transistor, a lower power transistor, an output inductor, and an output capacitor, wherein a negative end of the COMP is connected to the output end of the drive unit, wherein a positive end of the COMP is connected to a triangular wave signal end, wherein the output end of the COMP outputs a square voltage signal having a predetermined duty cycle, wherein input ends of the two BUFs are separately connected to the output end of the COMP, wherein output ends of the two BUFs are respectively connected to a gate of the lower power transistor and a gate of the upper power transistor, wherein a source of the upper power transistor is connected to a power supply end, wherein a source of the lower power transistor is connected to a ground end, wherein a drain of the lower power transistor and a drain of the upper power transistor are connected to one end of the output inductor, wherein another end of the output inductor is connected to a non-ground end of the output capacitor, and wherein another end of the output capacitor is grounded.

17. The chip structure according to claim 16, wherein a loop operational amplifier error amplifier (EA) unit comprises a feedback compensation network and a loop operational amplifier EA, wherein a first port of the feedback compensation network is connected to a negative end of the loop operational amplifier EA, wherein a second port of the feedback compensation network is connected to a non-ground end of the output capacitor of the power stage circuit, wherein a third port of the feedback compensation network is connected to an output end of the loop operational amplifier EA, and wherein a positive end of the loop operational amplifier EA is connected to a reference voltage end.

18. The chip structure according to claim 17, wherein the feedback compensation network comprises a first resistor, a second resistor, a third resistor, a fourth resistor, a first capacitor, a second capacitor, and a third capacitor, wherein a connection point between the first resistor and the second resistor is the second port after being connected in series to the first capacitor, the first resistor is further connected in parallel to the second resistor, wherein a connection point between the second resistor and the first capacitor is the first port, wherein the third resistor is further connected in parallel to the third capacitor after being connected in series to the second capacitor, wherein a connection point between the third resistor and the third capacitor is connected to the first port, wherein a connection point between the second capacitor and the third capacitor is the third port, and wherein one end of the fourth resistor is connected to the first port, and the other end of the fourth resistor is connected to a ground end.

19. The chip structure according to claim 9, wherein the loop operational amplifier EA unit is disposed in a center position of the chip die.

20. The chip structure according to claim 9, wherein the M drive units are disposed around the loop operational amplifier EA unit.

* * * * *